United States Patent
Chuang et al.

(10) Patent No.: US 9,123,694 B2
(45) Date of Patent: Sep. 1, 2015

(54) N/P BOUNDARY EFFECT REDUCTION FOR METAL GATE TRANSISTORS

(71) Applicant: TAIWAN SEMICONDUCTOR MANUFACTURING COMPANY, LTD., Hsin-Chu (TW)

(72) Inventors: Hak-Lay Chuang, Singapore (SG); Cheng-Cheng Kuo, Hsinchu (TW); Ching-Che Tsai, Zhubei (TW); Ming Zhu, Singapore (SG); Bao-Ru Young, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/231,809

(22) Filed: Apr. 1, 2014

(65) Prior Publication Data
US 2014/0203374 A1   Jul. 24, 2014

Related U.S. Application Data

(62) Division of application No. 13/299,152, filed on Nov. 17, 2011, now Pat. No. 8,703,595.

(51) Int. Cl.
| | |
|---|---|
| H01L 27/108 | (2006.01) |
| H01L 29/423 | (2006.01) |
| H01L 21/28 | (2006.01) |
| H01L 29/66 | (2006.01) |
| H01L 21/027 | (2006.01) |
| H01L 21/8234 | (2006.01) |
| H01L 21/3213 | (2006.01) |
| H01L 27/02 | (2006.01) |
| H01L 27/092 | (2006.01) |
| H01L 29/49 | (2006.01) |
| H01L 29/51 | (2006.01) |

(52) U.S. Cl.
CPC ...... H01L 29/42356 (2013.01); H01L 21/0274 (2013.01); H01L 21/28123 (2013.01); H01L 21/32139 (2013.01); H01L 21/823456 (2013.01); H01L 27/0207 (2013.01); H01L 27/092 (2013.01); H01L 29/66545 (2013.01); H01L 29/4966 (2013.01); H01L 29/513 (2013.01); H01L 29/517 (2013.01)

(58) Field of Classification Search
CPC . H01L 23/532; H01L 27/0928; H01L 29/495; H01L 29/42376; H01L 29/42372
USPC .................................................. 257/371, 412
See application file for complete search history.

(56) References Cited

U.S. PATENT DOCUMENTS

| | | | |
|---|---|---|---|
| 7,927,943 B2 | 4/2011 | Yeh et al. | |
| 7,979,829 B2 | 7/2011 | Smayling | |
| 8,003,463 B2 | 8/2011 | Anderson et al. | |
| 2010/0306719 A1* | 12/2010 | Smayling .......................... 716/4 |

* cited by examiner

*Primary Examiner* — Thomas L Dickey
(74) *Attorney, Agent, or Firm* — Haynes and Boone, LLP

(57) ABSTRACT

The present disclosure provides a device having a doped active region disposed in a substrate. The doped active region having an elongate shape and extends in a first direction. The device also includes a plurality of first metal gates disposed over the active region such that the first metal gates each extend in a second direction different from the first direction. The plurality of first metal gates includes an outer-most first metal gate having a greater dimension measured in the second direction than the rest of the first metal gates. The device further includes a plurality of second metal gates disposed over the substrate but not over the doped active region. The second metal gates contain different materials than the first metal gates. The second metal gates each extend in the second direction and form a plurality of respective N/P boundaries with the first metal gates.

19 Claims, 13 Drawing Sheets

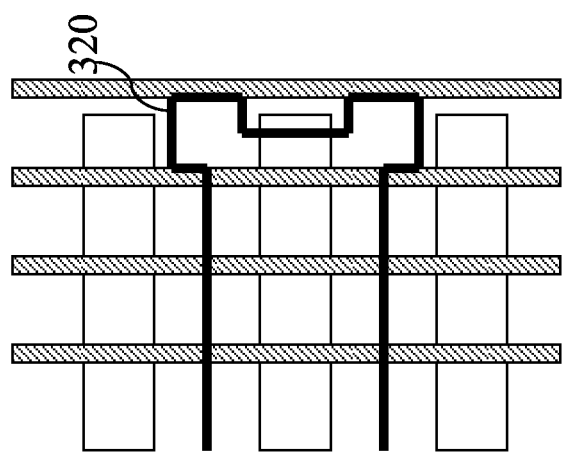

FIG. 10 is a flowchart illustrating a method of fabricating a semiconductor device according to various aspects of the present disclosure.

N/P BOUNDARY EFFECT REDUCTION FOR METAL GATE TRANSISTORS

PRIORITY DATA

The present application is a divisional patent application of U.S. patent application Ser. No. 13/299,152, filed on Nov. 17, 2011, entitled "N/P Boundary Effect Reduction for Metal Gate Transistors", the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

To enhance the performance of ICs, metal gate transistors have been used in recent years. However, conventional metal gate transistors may suffer from an N/P boundary effect. In more detail, when a P-type metal gate transistor borders an N-type metal gate transistor, contamination may occur through metal diffusion across the boundary between the P-type and N-type metal gate transistors. Such contamination may degrade the threshold voltage ($V_t$) of the metal gate transistors. Moreover, as device sizes continue to shrink, limitations in current lithography technology may exacerbate the undesirable $V_t$ shifting issue discussed above, thereby further degrading the performance of conventional metal gate transistors.

Therefore, while existing methods of fabricating metal gate transistors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A and 5C-5D are top views of example layout patterns.

SUMMARY

Figure 1:
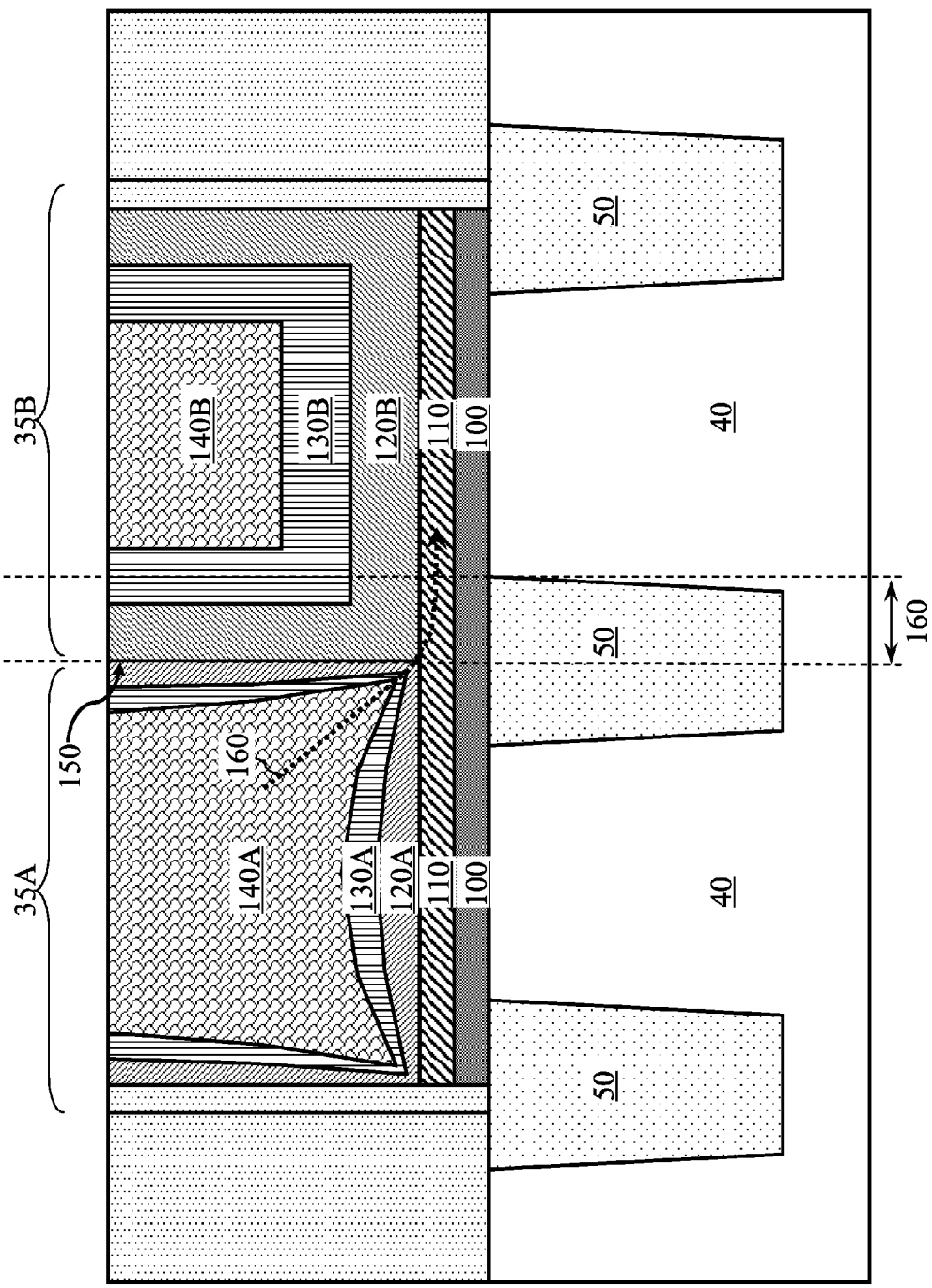
FIG. 1 is a diagrammatic cross-sectional view of a semiconductor device according to various aspects of the present disclosure.

One of the broader forms of the present disclosure involves a method of fabricating a semiconductor device. The method includes: forming a first dummy gate and a second dummy gate over a substrate; forming a patterned mask over the first and second dummy gates, the patterned mask exposing a first segment of the first dummy gate and a second segment of the second dummy gate, while covering a third segment of the first dummy gate and a fourth segment of the second dummy gate, wherein the forming the mask is carried out in a manner such that the first and second segments have significantly different lengths; replacing the first segment and the second segment with a first metal gate and a second metal gate, respectively, the first and second metal gates containing a first type metal material; and replacing the third segment and the fourth segment with a third metal gate and a fourth metal gate, respectively, the third and fourth metal gates containing a second type metal material different from the first type.

In some embodiments, one of the first and second segments is longer than the other; and a ratio of a longer one of the first and second segments to a shorter one of the first and second segments is greater than 1:1 but less than 1.5:1.

In some embodiments, the forming the patterned mask is carried out using an optical proximity correction (OPC) technique.

In some embodiments, the first and second dummy gates each extend in a first direction; and the patterned mask defines an elongate contour that extends in a second direction different from the first direction.

In some embodiments, the first direction is substantially perpendicular to the second direction; and the first and second segments are confined within the elongate contour.

In some embodiments, an end portion of the contour is wider in the first direction than a rest of the contour; and the end portion of the contour coincides with an edge of one of the first and second segments.

In some embodiments, the first and second dummy gates each contain a polysilicon material.

In some embodiments, the first type metal material includes a P-type metal; and the second type metal material includes an N-type metal.

In some embodiments, the first and second metal gates are formed over an active region; a first N/P boundary is formed by an interface between the first and third segments; a second N/P boundary is formed by an interface between the second and fourth segments; and a first distance from an edge of the active region to the first N/P boundary is less than a second distance from the edge of the active region to the second N/P boundary.

Another of the broader forms of the present disclosure involves a method of fabricating a semiconductor device. The method includes: forming a plurality of dummy gates over a substrate, the dummy gates extending along a first axis; forming a masking layer over the dummy gates, the masking layer defining an elongate opening that extends along a second axis different from the first axis, wherein the opening exposes a plurality of first portions of the dummy gates and protects a plurality of second portions of the dummy gates, wherein a tip portion of the opening has a width greater than a width of a non-tip portion of the opening, and wherein the forming the masking layer includes performing an optical proximity correction (OPC) process; replacing the first portions of the dummy gates with a plurality of first metal gates; and replacing the second portions of the dummy gates with a plurality of second metal gates different from the first metal gates.

In some embodiments, the second axis is approximately orthogonal to the first axis; and the width of the tip portion is measured along the first axis.

In some embodiments, the OPC process includes using a serif assistant feature or a hammerhead assistant feature.

In some embodiments, the first metal gates contain P-type work function metal layers; and the second metal gates contain N-type work function metal layers.

In some embodiments, the first metal gates are formed over an active region for a P-type transistor; a plurality of N/P boundaries are formed by respective pairs of the first and second metal gates; and an outer-most N/P boundary is spaced farther apart from the active region than the rest of the N/P boundaries.

In some embodiments, a ratio between the width of the tip portion of the opening and the width of the non-tip portion of the opening is greater than 1:1 but less than 1.5:1.

In some embodiments, the dummy gates each contain a polysilicon gate electrode.

Yet another of the broader forms of the present disclosure involves a semiconductor device. The semiconductor device includes: a doped active region disposed in a substrate, the doped active region having an elongate shape and extends in a first direction; a plurality of first metal gates disposed over the active region, wherein the first metal gates each extend in a second direction different from the first direction, and wherein an outer-most first metal gate has a greater dimension measured in the second direction than the rest of the first metal gates; and a plurality of second metal gates disposed over the substrate but not over the doped active region, wherein the second metal gates contain different materials than the first metal gates, and wherein the second metal gates each extend in the second direction and form a plurality of respective N/P boundaries with the first metal gates.

In some embodiments, the doped active region includes a source/drain region for a P-type transistor; the first metal gates each include a P-type work function metal; and the second metal gates each include an N-type work function metal.

In some embodiments, a distance between the doped active region and an outer-most N/P boundary exceeds a distance between the doped active region and other N/P boundaries.

In some embodiments, the first direction is approximately perpendicular to the second direction.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

As semiconductor fabrication technologies continue to advance, metal gate transistors have been used instead of polysilicon gate transistors to improve the performance of Integrated Circuit (IC) devices. The metal gate transistors employ a high-k material gate dielectric and a metal gate electrode. For the sake of facilitating the ensuing discussions, a diagrammatic fragmentary cross-sectional side view of a high-k metal gate device 35 is shown in FIG. 1 according to various aspects of the present disclosure.

Referring to FIG. 1, the high-k metal gate device 35 includes an N-type transistor 35A (N-type Metal Oxide Semiconductor Field Effect Transistor, or NMOS) and a P-type transistor 35B (P-type Metal Oxide Semiconductor Field Effect Transistor, or PMOS). The NMOS 35A and PMOS 35B are formed over a substrate 40. The substrate 40 is a silicon substrate doped with a P-type dopant such as boron (for example a P-type substrate). Alternatively, the substrate 40 could be another suitable semiconductor material. For example, the substrate 40 may be a silicon substrate that is doped with an N-type dopant such as phosphorous or arsenic (an N-type substrate). The substrate 40 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 40 could include an epitaxial layer (epi layer), may be strained for performance enhancement, and may include a silicon-on-insulator (SOI) structure.

Isolation structures 50 are formed in the substrate 40. In some embodiments, the isolation structures 50 include Shallow Trench Isolation (STI) features. The STI features are formed by etching recesses (or trenches) in the substrate 40 and filling the recesses with a dielectric material. In some embodiments, the dielectric material of the STI features includes silicon oxide. In alternative embodiments, the dielectric material of the STI features may include silicon nitride, silicon oxy-nitride, fluoride-doped silicate (FSG), and/or a low-k dielectric material known in the art. In yet other embodiments, the isolation structures 50 may include other types of isolation features such as such as Deep Trench Isolation (DTI) features.

A gate dielectric layer 100 is then formed over the interfacial layer. The gate dielectric layer 100 is formed by a chemical vapor deposition (CVD) process or an atomic layer deposition (ALD) process. In the illustrated embodiments, the gate dielectric layer 100 includes a high-k dielectric material. A high-k dielectric material is a material having a dielectric constant that is greater than a dielectric constant of $SiO_2$, which is approximately 4. In an embodiment, the gate dielectric layer 100 includes hafnium oxide ($HfO_2$), which has a dielectric constant that is in a range from approximately 18 to approximately 40. In alternative embodiments, the gate dielectric layer 100 may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO. It is understood that an interfacial layer may be optionally formed between the substrate 40 and the gate dielectric layer 100. The interfacial layer may be formed by an ALD process and may include a dielectric material such as silicon oxide ($SiO_2$).

A capping layer 110 is formed over the gate dielectric layer 100. The capping layer 110 may be formed by a deposition process such as CVD, physical vapor deposition (PVD), or ALD. The capping layer 110 prevents diffusion between the gate dielectric layer 100 and the metal layers thereabove. In some embodiments, the capping layer 110 contains titanium nitride.

The NMOS device 35A and the PMOS device 35B each include a respective metal gate electrode formed over the capping layer 110. The NMOS gate electrode includes a work function metal layer 120A, a blocking layer 130A, and a fill metal layer 140A. The PMOS gate electrode includes a work function metal layer 120B, a blocking layer 130B, and a fill metal layer 140B. The work function metal layers 120A-120B, the blocking layers 130A-130B, and the fill metal layers 140A-140B are each formed by one or more deposition processes such as CVD, PVD, ALD, or plating.

The work function metal layers 120A-120B are configured to tune a work function of its corresponding transistor to achieve a desired threshold voltage $V_t$. In some embodiments, the work function metal layer 120A contains one of: TiAl, TiAlN, or TaCN, or combinations thereof. In some embodiments, the work function metal layer 120B contains one of: TiN, WN, or W, or combinations thereof. In other embodiments, the work function metal layers 120A-120B may include other metal materials that are suitable for application or manufacturing considerations.

The blocking layers 130A-130B are configured to block or reduce diffusion between the layers therebelow (e.g., the work function metal layers 120A-120B) and the layers thereabove (e.g., the fill metal layers 140A-140B). In some embodiments, the blocking layer 130A and the blocking layer 130B each contain one of: TiN, TiON, TaN, TaON, or combinations thereof. The blocking layer 130A and the blocking layer 130B may have different thicknesses.

The fill metal layers 140A-140B are configured to serve as the main conductive portion of the NMOS and PMOS gate electrodes, respectively. In some embodiments, the fill metal layers 140A-140B each contain Aluminum (Al). In other embodiments, the fill metal layers 140A-140B may include contain other conductive materials such as Tungsten (W), Copper (Cu), or combinations thereof.

The metal gate electrodes of the NMOS device 35A and the PMOS device 35B may be formed by a gate replacement process. For example, using a gate-last approach, dummy polysilicon gate electrodes are first formed on a high-k gate dielectric layer. A plurality of ion implantation and/or diffusion processes are then performed to form source/drain regions of the transistors, followed by high temperature annealing processes to activate the source/drain regions. Thereafter, the dummy polysilicon gate electrodes are removed and replaced by the metal gate electrodes discussed above. Alternatively, in a high-k last approach (also considered a form of gate-replacement process), a dummy silicon oxide gate dielectric layer may be formed first. The rest of the steps for the high-k last approach are similar to the gate-last approach, except that the dummy silicon oxide gate dielectric layer is removed along with the removal of the dummy polysilicon gate electrodes. A high-k gate dielectric layer is then formed to replace the dummy silicon oxide gate dielectric layer, and then the metal gate electrodes are formed over the high-k gate dielectric layer.

Regardless of the specific approach used to form the high-k metal gate device, in many cases the NMOS and PMOS transistors are bordering each other (such as the NMOS and PMOS metal gate transistors 35A and 35B of FIG. 1). In other words, an N/P boundary 150 exists between these bordering NMOS and PMOS transistors. Since the NMOS and PMOS transistors 35A and 35B are intended to operate independently, metal diffusion across the boundary 150 may become a concern. This is because such diffusion may affect the threshold voltage of these transistors.

An example diffusion path 160 is shown in FIG. 1, which illustrates that the metal material (e.g., Aluminum) from the fill metal layer 140A may diffuse across the N/P boundary 150 and to the PMOS transistor. This diffusion is likely to occur, because the NMOS blocking layer 130A is quite narrow/thin, particularly near the corner between the fill metal layer 140A and the N/P boundary 150. Consequently, the NMOS blocking layer 130A may not be able to effectively block or prevent diffusion due to its narrowness. The capping layer 110 of the PMOS transistor 35B will thus be contaminated, which results in a higher threshold voltage $V_t$ for the PMOS transistor 35B compared to PMOS transistors without an N/P boundary (i.e., a PMOS transistor not bordering an NMOS transistor). This may be referred to as a boundary effect.

The boundary effect is exacerbated as semiconductor devices continue to be scaled down. For example, a distance 160 between the N/P boundary 150 and an active region (e.g., source/drain region) of the PMOS transistor may shrink as part of the scaling down process. Therefore, the diffusion path 160 may shrink as well, thereby facilitating the undesirable diffusion across the N/P boundary 150 and the contamination of the PMOS transistor 35B.

It is noted that the diffusion from the PMOS transistor 35B to the NMOS transistor 35A is not as much of a concern, partially because the blocking layer 130B for the PMOS transistor is much thicker (and therefore more capable of preventing diffusion), and also partially because the fill metal layer 140B of the PMOS transistor 35B is located farther away from the N/P boundary 150 (and therefore lengthening the diffusion path). Thus, the unintended threshold voltage shift for the PMOS transistor 35B is of more concern.

Figure 2:
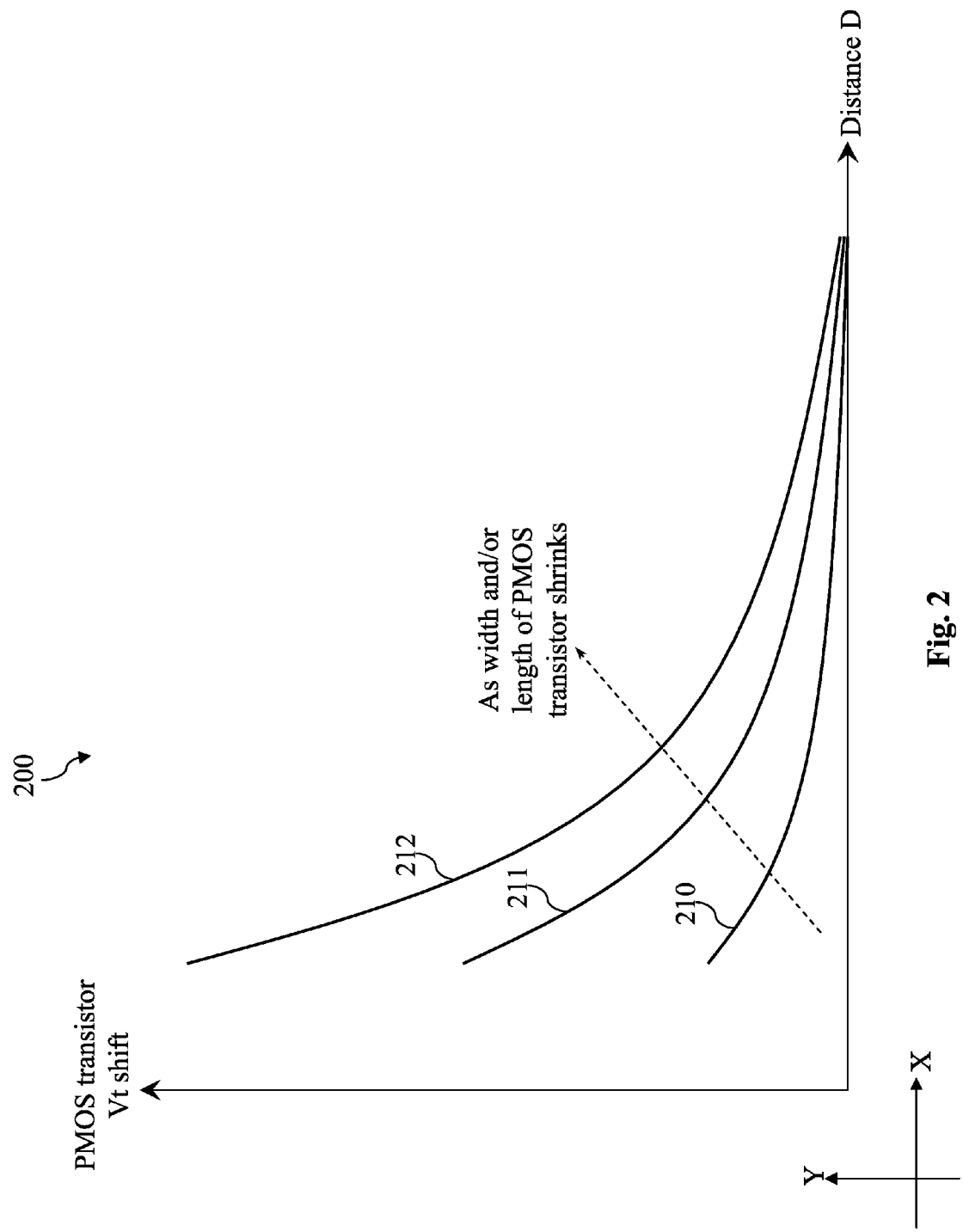
FIG. 2 is a graph illustrating a relationship between a threshold voltage shift versus a distance between an active region and an N/P boundary.

FIG. 2 is a graph 200 that illustrates the relationship between the threshold voltage shift and various other factors such as transistor device size and distance between the N/P boundary and the PMOS active region. Referring to FIG. 2, the graph 200 includes an X-axis and a Y-axis that is perpendicular to the X-axis. The X-axis represent the distance (e.g., the distance 160 of FIG. 1) between an N/P boundary and the PMOS active region, denoted herein as distance "D". The Y-axis represents the amount of shift in the threshold voltage $V_t$ of the PMOS transistor (e.g., the PMOS transistor 35B).

The graph 200 contains a plurality of curves 210-212 that represent plots of the threshold voltage $V_t$ versus the distance D. It can be seen that as the distance D increases, the amount of threshold voltage shift is reduced. In other words, a larger distance D is desired, since it corresponds to a minimal amount of threshold voltage shift. On the other hand, a small distance D causes a large amount of threshold voltage shift, which is undesirable.

Meanwhile, the width and length of the PMOS transistor also affects the threshold voltage shift. The dashed line in FIG. 2 indicates the direction in which the curves 210-212 move as the width and/or length of the PMOS transistor decreases. For example, the curve 212 represents a PMOS transistor having smaller width and/or length than that of the PMOS transistor represented by the curve 211, and the curve 211 represents a PMOS transistor having smaller width and/or length than that of the PMOS transistor represented by the curve 210. As such, at any given fixed distance D, the curve 212 has the greatest amount of threshold voltage shift (undesirable), the curve 211 has an intermediate amount of threshold voltage shift (less undesirable), and the curve 210 has the least amount of threshold voltage shift (more desirable).

Thus, based on the relationships indicated in FIG. 2, it can be seen that in order to minimize the amount of threshold voltage shift, the distance D between an N/P boundary and the PMOS active region should be maximized, and the width and length of the PMOS transistor should be maximized as well. However, the trend in modern semiconductor fabrication is the continued scaling down process—continued reductions of semiconductor feature dimensions. Thus, since it is not always feasible to maximize the distance D or the width and length of transistors, it is important to ensure that the various feature sizes do not experience unintentional variations as part of the fabrication process, because these variations may lead to severe degradations in uniformity (for example, threshold voltage uniformity).

Unfortunately, limitations in current lithography technology may cause these undesirable variations. For example, a line-end rounding effect in a lithography process may unintentionally reduce the size of a PMOS metal gate transistor, and/or reduce the distance between the N/P boundary and the PMOS active region. To avoid these problems, a method of fabricating metal gate transistors is discussed below with reference to FIGS. 3-9. In more detail, FIGS. 3-4 and 6-9 are diagrammatic fragmentary top views of a portion of a semiconductor wafer at various stages of fabrication according to some embodiments of the present disclosure, and FIG. 5 includes diagrammatic top views of various layout patterns.

Figure 3:
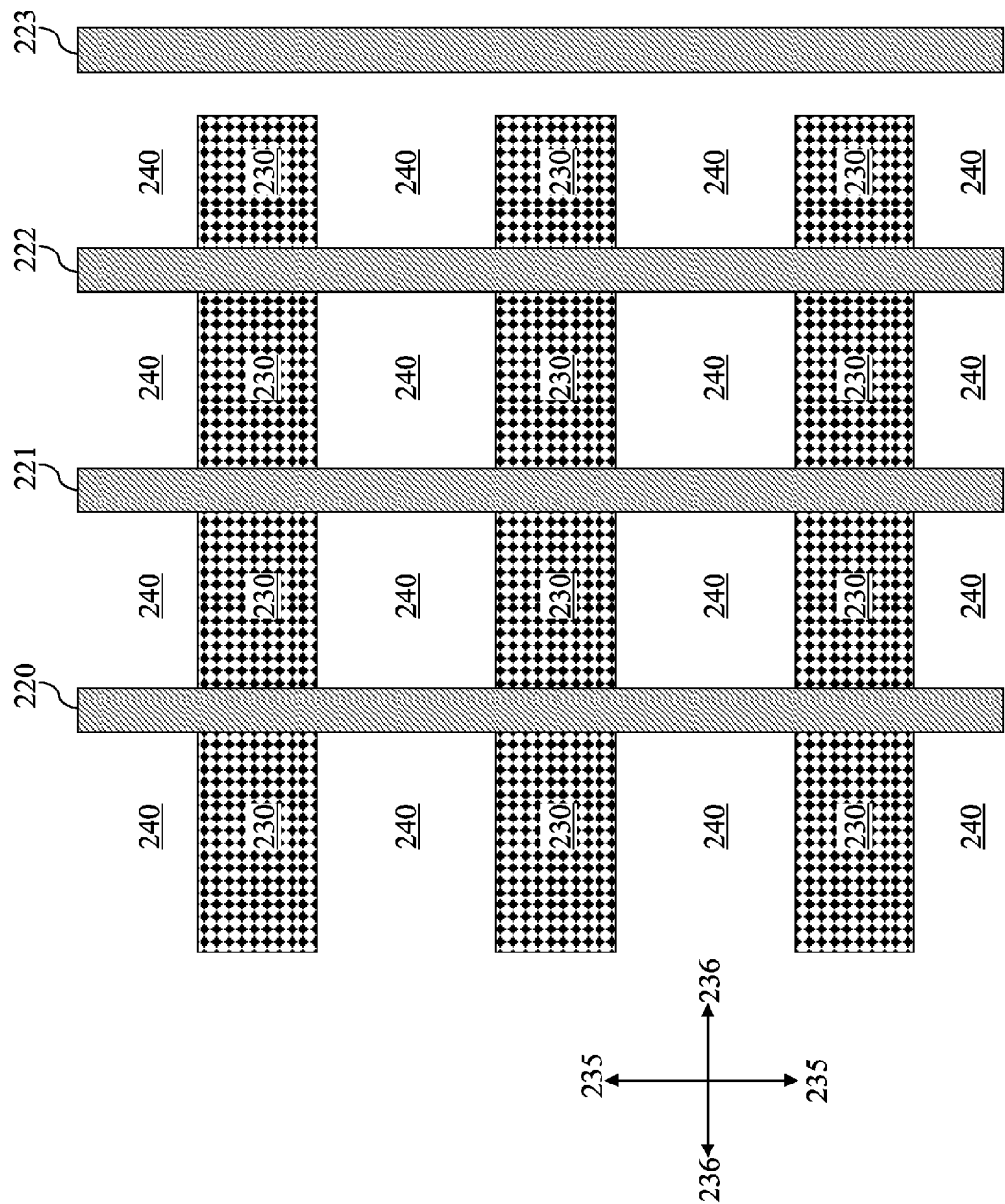
FIGS. 3-4 and 6-9 are diagrammatic top view of a semiconductor device at various stages of fabrication according to the various aspects of the present disclosure.

Referring to FIG. 3, the wafer includes a substrate. The substrate may be similar to the substrate 40 of FIG. 1, and may be doped and may contain a plurality of isolation structures. The wafer also includes a plurality of gates, four of which are illustrated herein as gates 220-223. The gates 220-223 illustrated herein have elongate rectangular shapes, and as such they may also be referred to as gate strips or gate lines 220-223. In the illustrated embodiments, the gate lines 220-223 are dummy gate electrodes and include a polysilicon material. Although not shown in the top view of FIG. 3, it is understood that each of the gate lines 220-223 may have a gate dielectric layer formed therebelow. The gate dielectric layer may contain a high-k material.

The wafer includes active regions 230. The active regions may include lightly-doped source/drain regions and heavily-doped source/drain regions. These lightly-doped source/drain regions and heavily-doped source/drain regions may each be formed by a plurality of ion implantation processes and diffusion processes. The formation of these regions may be performed using a plurality of patterning processes. The gate lines 220-223 may be used as patterning masks during these patterning processes.

In the illustrated embodiments, the gate lines 220-223 have elongate shapes and extend in a direction 235. In comparison, the active regions 230 extend in a direction 236, which is different from the direction 235. In some embodiments, the directions 235 and 236 are substantially perpendicular or orthogonal to each other.

The wafer also includes an interlayer (or interlevel) dielectric (ILD) layer 240 formed between the gate lines 220-223. The ILD layer 240 contains a dielectric material, such as silicon oxide, silicon nitride, silicon oxynitride, or a low-k material. At the stage of fabrication shown in FIG. 3, the ILD layer 240 has been formed and polished by a polishing process (e.g., a chemical-mechanical-polishing process) to have a planarized surface with the gate lines 220-223.

Figure 4:
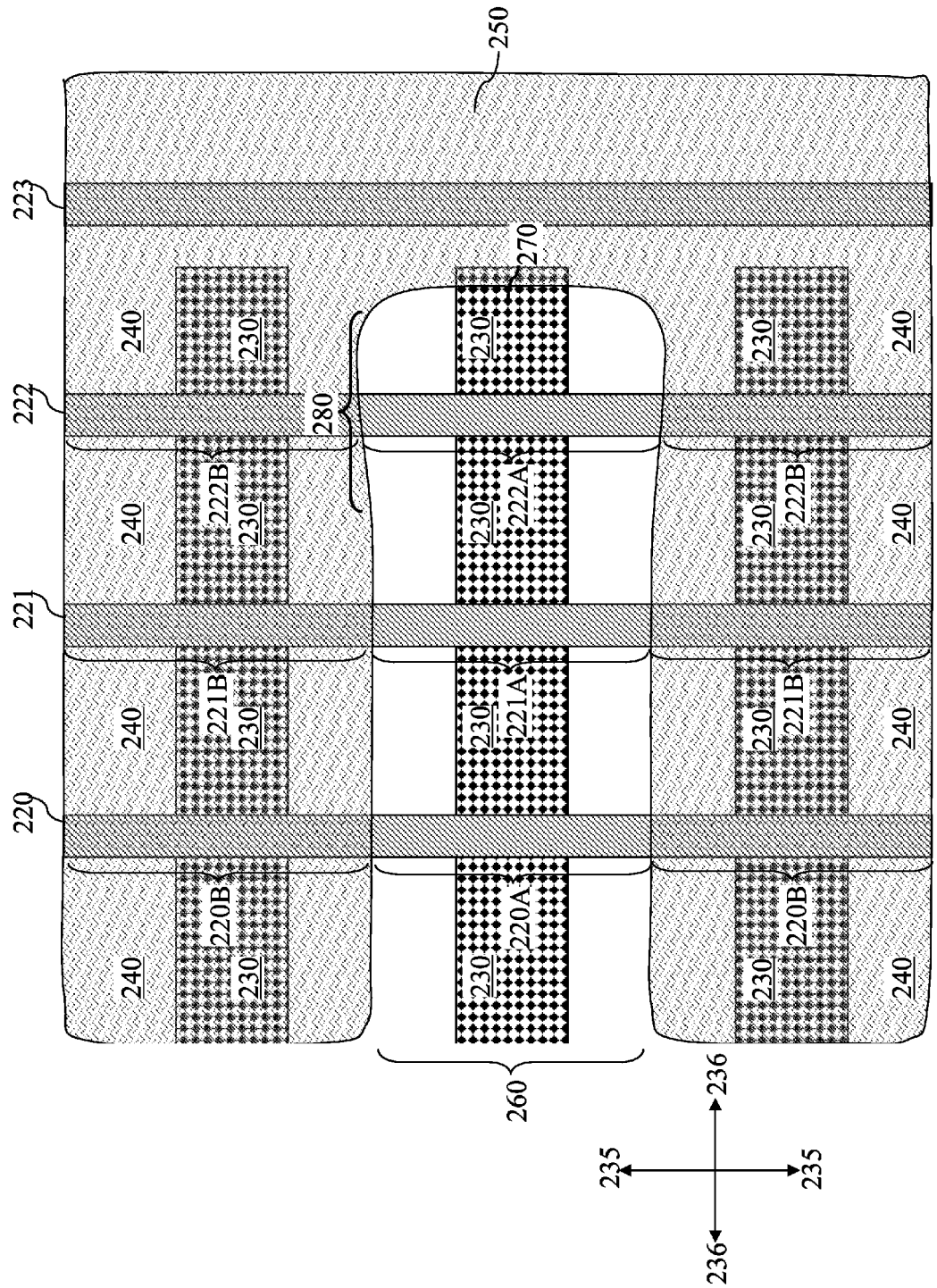

Referring now to FIG. 4, a patterned mask 250 is formed over the wafer. In some embodiments, the patterned mask 250 includes a photoresist mask. In other embodiments, the patterned mask 250 may include a hard mask. The patterned mask 250 is formed by a lithography process, which may involve one or more masking, exposing, baking, rinsing, and etching processes (not necessarily in that order).

The patterned mask 250 defines a contour (or an opening) 260. The contour 260 has an elongate shape and extends along the direction 236 (same direction as the active region 230 but perpendicular to that of the gate lines 220-223). The contour 260 divides each of the gate lines 220-222 into two segments or portions: segments 220A-222A that are exposed by (or disposed within) the contour 260 and segments 220B-222B that are disposed outside of the contour 260 (or covered by the mask 250). Eventually, the exposed segments 220A-222A will each be replaced by one type of metal gate (e.g., a PMOS gate), while the covered segments 220B-222B will each be replaced by another type of metal gate (e.g., an NMOS gate). This will be discussed in more detail later.

Still referring to FIG. 4, among the exposed segments, the segment 222A may be considered an edge segment or outer-most segment, since it is located closest to an edge or tip 270 of the contour 260. Note that the contour 260 has another edge or tip opposite the tip 270, but since FIG. 4 is a fragmentary view, the contour 260 is only partially illustrated herein, and the other edge or tip is not illustrated. Alternatively stated, the contour 260 may be viewed as having a tip portion 280, which includes (but is not limited to) a portion of the contour 260 located near the tip 270 of the contour 260. The outer-most segment 222A is exposed by (and disposed within) the tip portion 280 of the contour 260. The interfaces between the segments 222A and 222B coincides with the boundaries of the tip portion 280.

As illustrated, the tip portion 280 of the contour 260 is wider (measured in the direction 235) than the rest of the contour 260. This is done to ensure that the outer-most segment 222A is longer (also measured in the direction 235) than the rest of the segments 220A-221A. This configuration helps reduce the threshold voltage shift, which will be discussed in more detail below. In some embodiments, the shape of the contour 260 (i.e., the wider tip portion 280) is obtained using an Optical Correction Proximity (OPC) technique. In more detail, refer to FIGS. 5A-5D, where FIGS. 5A and 5C-5D are diagrammatic top views of layout plans, and FIG. 5B is a top view of an example semiconductor device corresponding to the top view of the layout plan illustrated in FIG. 5A.

Figure 5A:
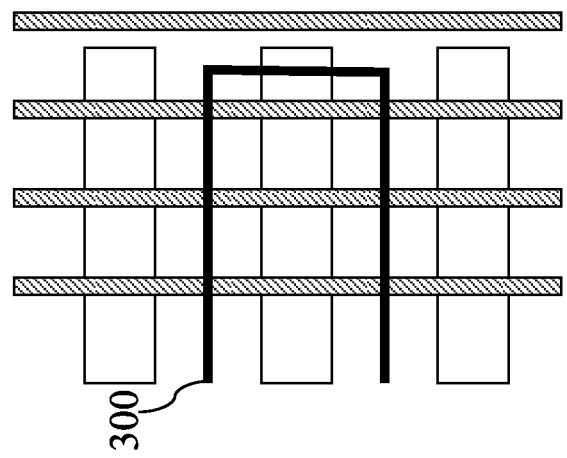
Figure 5B:
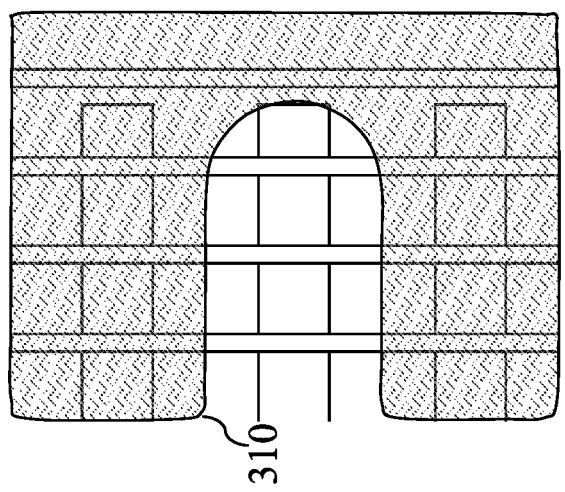
FIG. 5B is a top view of an actually fabricated pattern.
Figure 5D:
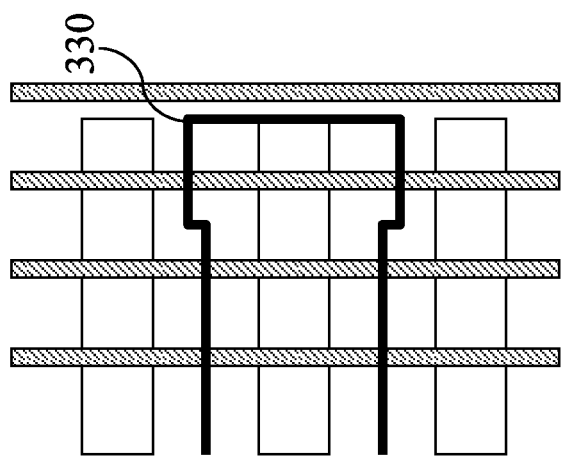

In FIG. 5A, a rectangular layout contour 300 may delineate the intended boundaries of a mask layer, for example the mask 250 of FIG. 4. The shape and geometries of the layout contour may be transferred to a corresponding photomask (not illustrated herein). Ideally, the rectangular shape of the layout contour 300 will be preserved during a subsequent lithography process, so that the formed mask will also demonstrate the shape of the layout contour 300. However, due to current lithography limitations, a line-end rounding effect may occur, which will form a mask having a contour 310 as shown in FIG. 5B. In more detail, the tip of the formed contour 310 is rounded or curved, as opposed to being rectangular as intended. If this were to happen to the contour 260 of FIG. 4, the segment 222A would have been shorter than the rest of the segments 220A-221A located away from the tip portion 280 of the contour 260. As discussed above, the segments 220A-222A and 220B-222B will eventually be replaced by metal gates. For reasons similar to those discussed above with reference to FIGS. 1-2, a shorter metal gate (corresponding to a shortened segment 222A) will have detrimental threshold voltage shift effects. Hence, the traditional approach of using a rectangular layout contour to form a desired rectangular contour may not be feasible.

In comparison, according to the various aspects of the present disclosure, an OPC technique is used to overcome the issues discussed above. The OPC technique employs assistant features to "help" the actual contour achieve a desired shape. FIGS. 5C and 5D illustrate two example assistant features: a serif assistant feature 320 in FIG. 5C and a hammerhead assistant feature 330 in FIG. 5D. These assistant features 320-330 of FIGS. 5C-5D can effectively minimize the line-end rounding effect of the fabricated mask contour. In the embodiments disclosed herein, assistant features similar to those shown in FIGS. 5C and 5D may be used and further configured to ensure that the tip portion 280 of the contour 260 does not suffer from the line-end rounding effect. In fact, the assistant features used in the OPC process herein help ensure that the tip portion 280 has a greater width than the rest of the contour 260. In this manner, the length of the segment 222A is formed to be at least as long as the rest of the segments 220A-221A.

Figure 6:
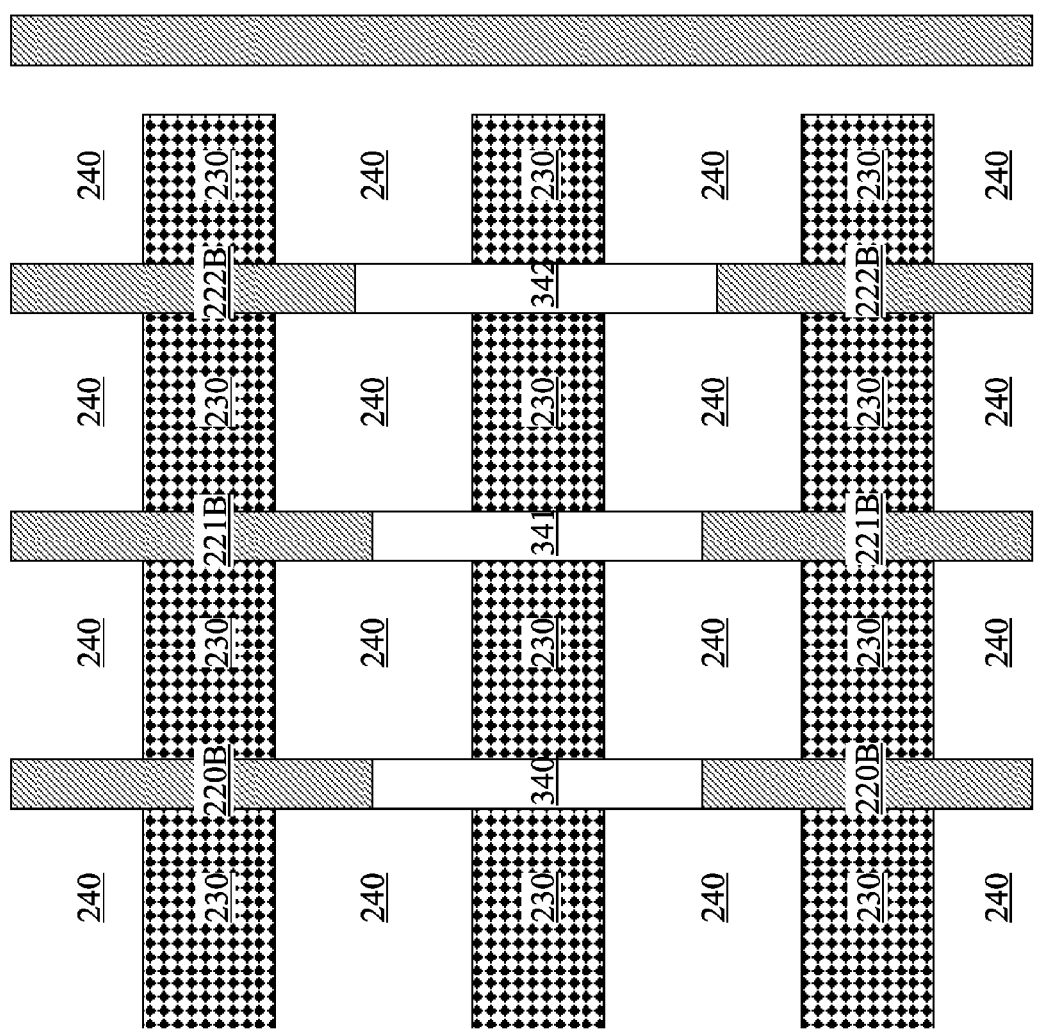

Referring now to FIG. 6, the segments 220A-222A are removed, thereby forming openings 340-342, respectively. The segments 220A-222A may be removed by an etching process, where the patterned mask 250 is used as an etching mask. Thereafter, the patterned mask 250 is removed through a suitable process such as an ashing process or a stripping process.

Figure 7:
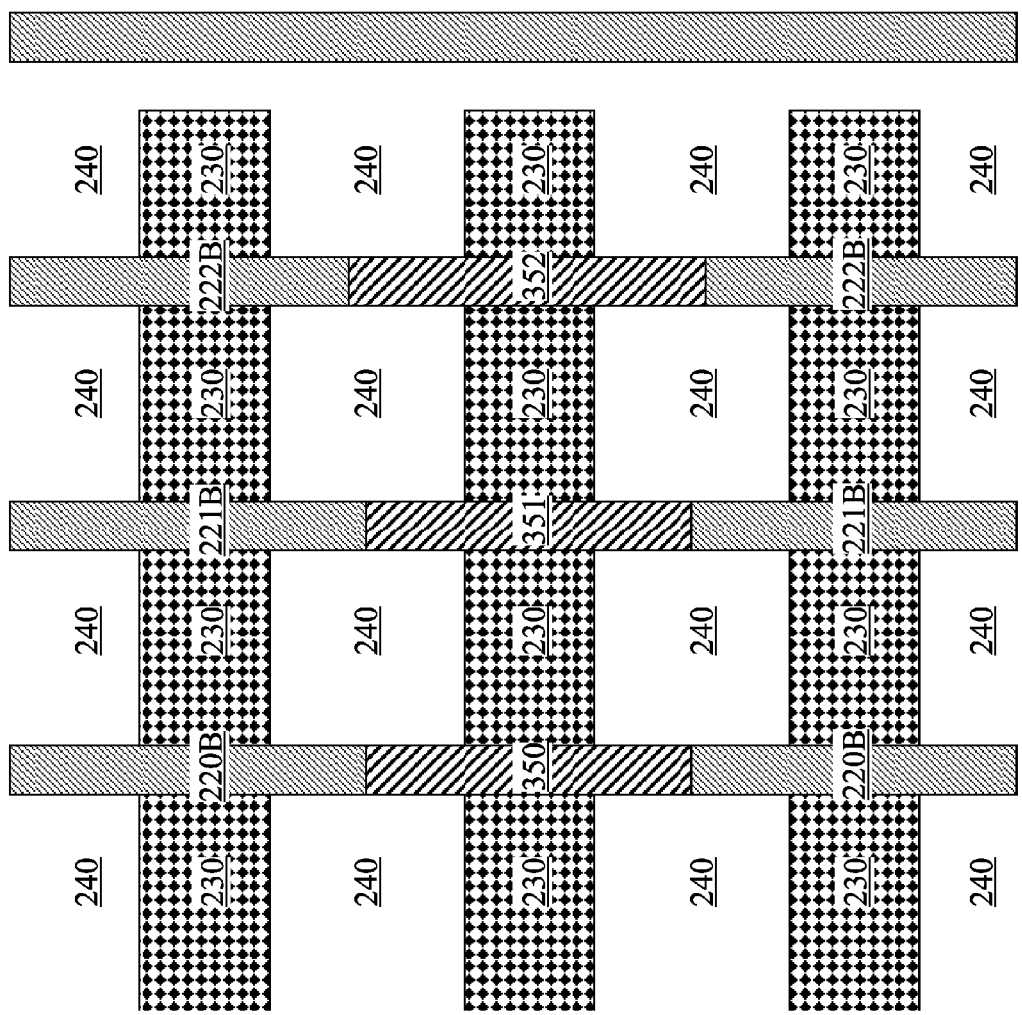

Referring now to FIG. 7, metal gates 350-352 are formed in the openings 340-342, respectively. In the embodiments illustrated, the metal gates 350-352 are P-type metal gates, similar to the metal gate of the PMOS transistor 35B of FIG. 1. Thus, the metal gates 350-352 each include a P-type work function metal, similar to the work function layer 120B of FIG. 1. The metal gates 350-352 may be formed by one or more deposition processes known in the art. Following the deposition processes, a polishing process such as a CMP process may be performed to planarize the surface of the metal gates 350-352.

Figure 8:
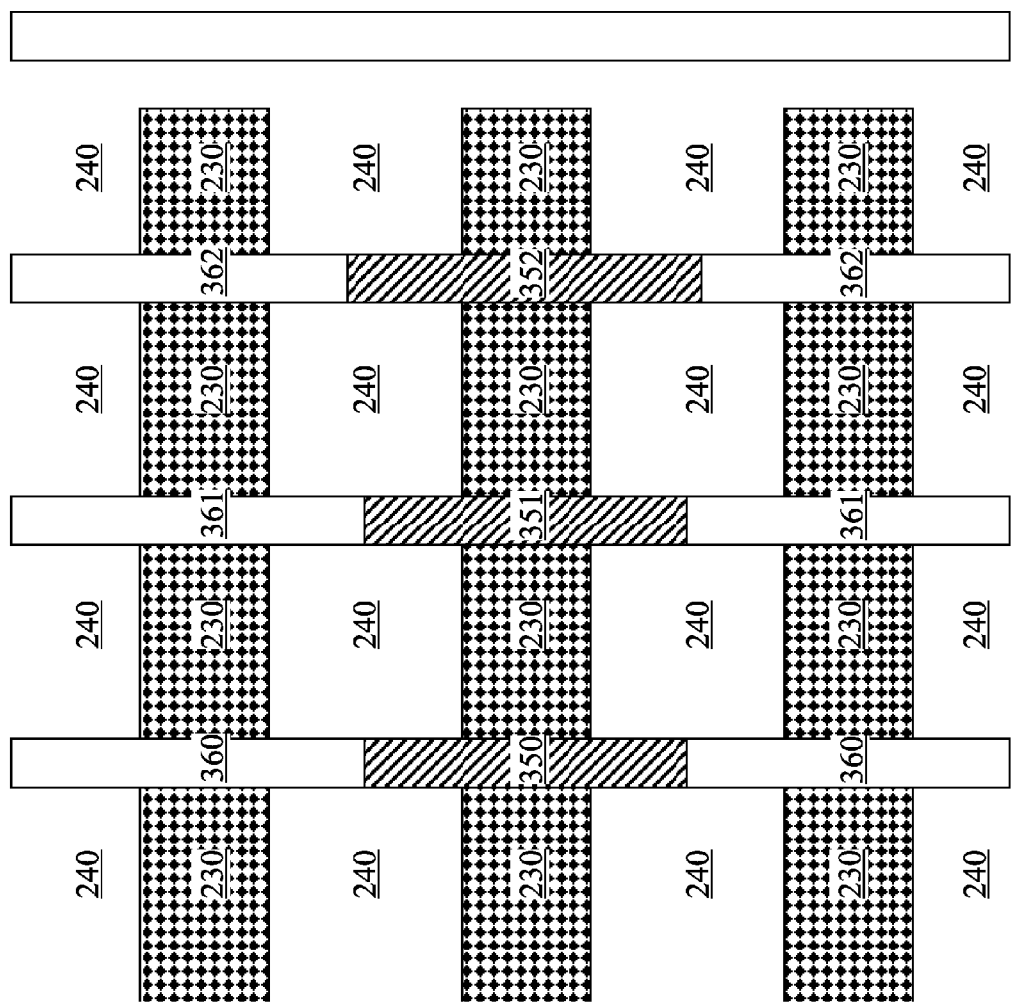

Referring now to FIG. 8, the segments 220B-222B of the dummy gates are removed, thereby forming openings 360-362. The removal of the segments 220B-222B may be carried out using an etching process. Meanwhile, the metal gates 350-352 still remain after the segments 220B-222B are removed.

Figure 9:
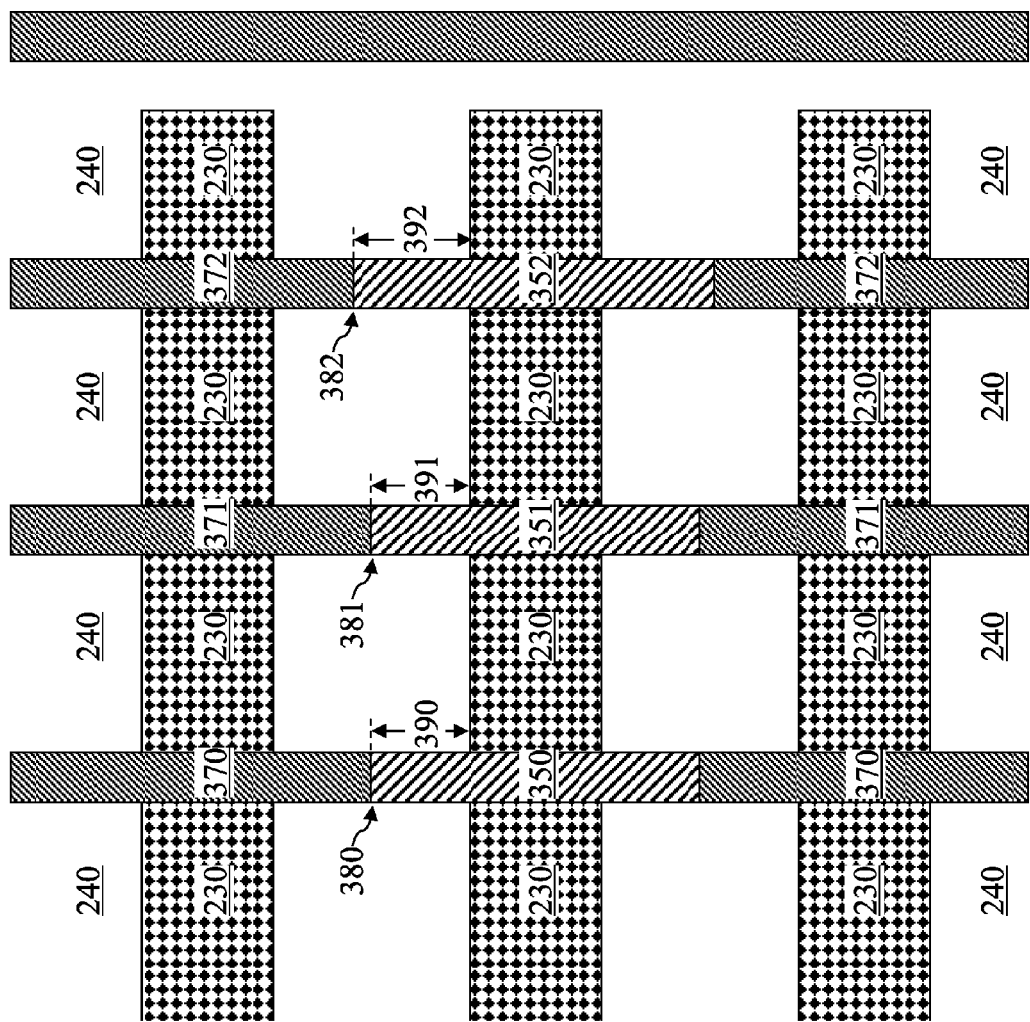

Referring now to FIG. 9, metal gates 370-372 are formed in the openings 360-362, respectively. In the embodiments illustrated, the metal gates 370-372 are N-type metal gates, similar to the metal gate of the NMOS transistor 35A of FIG. 1. Thus, the metal gates 370-372 each include an N-type work function metal, similar to the work function layer 120A of FIG. 1. The metal gates 370-372 may be formed by one or more deposition processes known in the art. Following the deposition processes, a polishing process such as a CMP process may be performed to planarize the surface of the metal gates 370-372. At this stage of fabrication, the dummy polysilicon gates 220-222 have been replaced by the metal gates 350-352 and 370-372.

N/P boundaries 380-382 are formed between the metal gates 350-352 and the metal gates 370-372, respectively. Similar to the N/P boundary 150, the N/P boundaries 380-382 represent the boundaries or interfaces between PMOS transistor gates and NMOS transistor gates. Distances 390-392 separate the N/P boundaries 380-382 from the edge of the active region 230 underneath (or intersecting with) the metal gates 350-352, respectively. In a cross-sectional view, the distances 390-392 each correspond to the distance 160 of FIG. 1. The active region 230 underneath the metal gates 350-353 is a P-type doped active region in the illustrated embodiments.

Metal diffusion across these boundaries 380-382 is undesirable and therefore should be minimized. In particular, diffusion from the NMOS transistor gates (corresponding to metal gates 370-372 herein) to the PMOS transistor gates (corresponding to metal gates 350-352) is more likely to occur, and therefore is of greater concern. According to the various aspects of the present disclosure, the distances 390-392 should be optimized. The optimization of the distances involves avoiding having one of the distances 390-392 being significantly shorter than the rest. Had a traditional patterning process been used to form the metal gates 350-352, the line-end rounding effect may occur, which would likely result in the distance 392 being shorter than the distances 390-391. This is undesirable, since as discussed above with reference to FIGS. 1-2, such short distance between the N/P boundary and the active region would increase the amount of threshold voltage variation for the transistor corresponding to the metal gates 352 and 372 (i.e., the outer-most transistor).

In comparison, the present disclosure utilizes an OPC technique to form metal gates 350-352 such that the outer-most metal gate 352 is longer than the rest of the metal gates 350-351. In other words, the distance 392 is greater than the distances 390-391. In some embodiments, a ratio of the distance 392 to the distances 390 or 391 is greater than 1:1 but less than 1.5:1. Having a greater distance 392 than the distances 390-391 does not tend to adversely impact the threshold voltage, because as FIG. 2 shows, as the distance D increases, the amount of threshold voltage shift decreases (e.g., approaching zero eventually). This is because as the distance between the N/P boundary and the active region increases, it becomes harder and harder for undesirable diffusion across the N/P boundary to occur. Therefore, the present disclosure offers the benefit of reducing the amount of threshold voltage shift.

It is understood that additional processes may be performed to complete the fabrication of the high-k metal gate semiconductor device. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The embodiments discussed above with reference to FIGS. 3-9 illustrate a "gate last" approach of a gate replacement fabrication process. It is understood that the various aspects of the present disclosure may also apply to a "high-k last" approach of the gate replacement process. In the high-k last process, a silicon oxide gate dielectric layer is formed first instead of a high-k dielectric gate dielectric. The oxide gate dielectric layer in the high-k last process also serves as a dummy layer and will be removed later along with the dummy polysilicon gate electrodes. A high-k dielectric layer may then be formed to replace the dummy silicon oxide gate dielectric layer. It is understood that the aspects of the present disclosure may apply to both a gate-last approach or a high-k last approach.

In addition, though the embodiments discussed above illustrate a process in which the PMOS metal gates are formed first, it is understood that NMOS metal gates may be formed first in alternative embodiments. For example, whereas the mask layer 250 may contain a positive photoresist, a negative photoresist mask may be employed, such that the contour 260 may protect the dummy polysilicon gates therebelow instead of exposing them. The dummy gate segments outside the contour may be removed and replaced with NMOS metal gates, and subsequently the PMOS metal gates may be formed. Once again, the aspects of the present disclosure may apply regardless of whether the PMOS gates are formed first or the NMOS gates are formed first.

Figure 10:
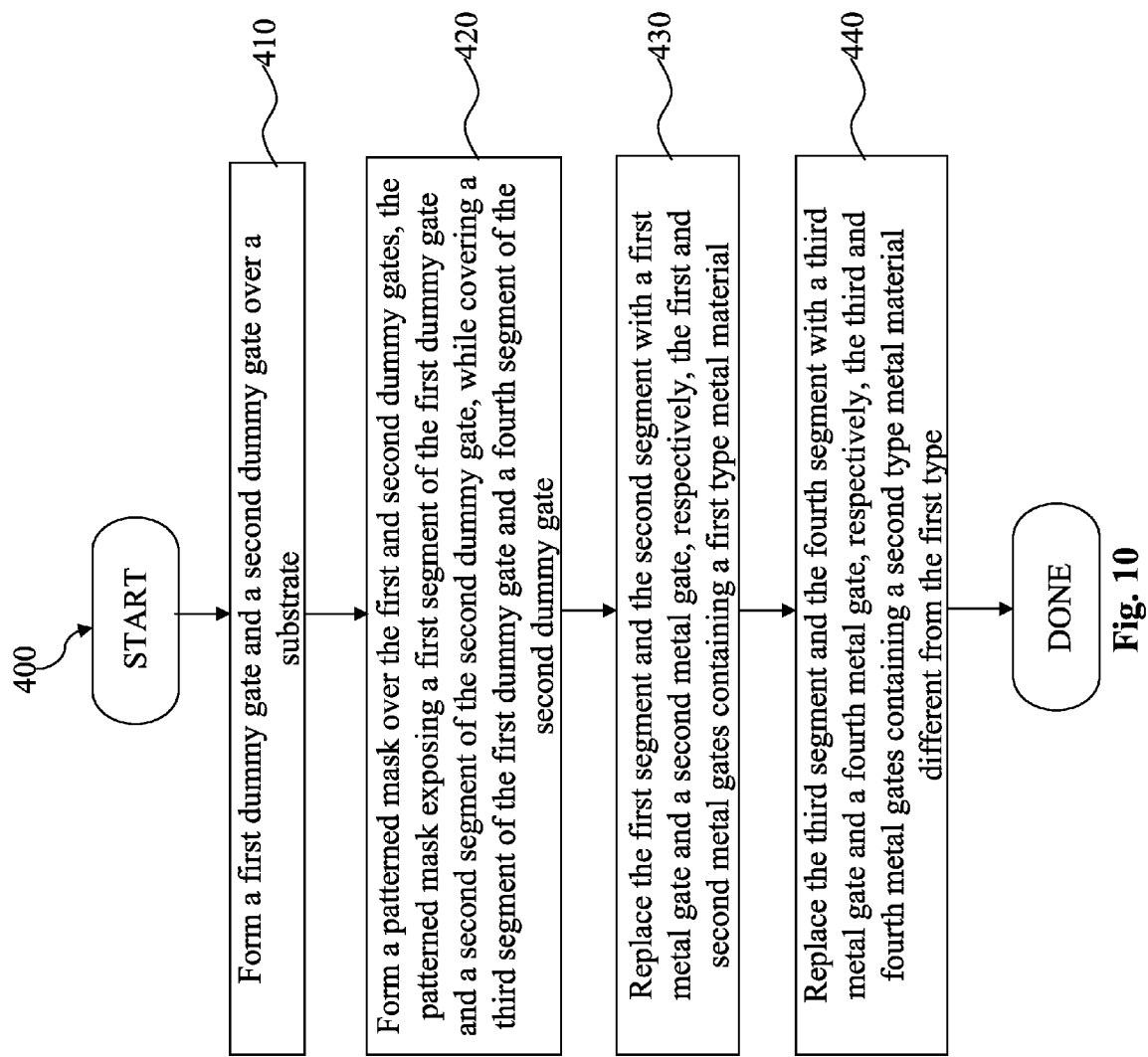
FIG. 10 is a flowchart illustrating a method of fabricating a semiconductor device according to various aspects of the present disclosure.

FIG. 10 is a method 400 of fabricating a semiconductor device according to various aspects of the present disclosure. Referring to FIG. 1, the method 400 includes a block 410, in which a first dummy gate and a second dummy gate are formed over a substrate. In some embodiments, the first and second dummy gates each include a dummy polysilicon gate electrode. The method 400 includes a block 420, in which a patterned mask is formed over the first and second dummy gates. The patterned mask exposes a first segment of the first dummy gate and a second segment of the second dummy gate, while covering a third segment of the first dummy gate and a fourth segment of the second dummy gate. The mask is formed in a manner such that the first and second segments have significantly different lengths. The method 400 includes a block 430, in which the first segment and the second segment are replaced with a first metal gate and a second metal gate, respectively. The first and second metal gates contain a first type metal material. The method 400 includes a block 440, in which the third segment and the fourth segment are replaced with a third metal gate and a fourth metal gate, respectively. The third and fourth metal gates contain a second type metal material different from the first type.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiment. One advantage is that the N/P boundary effect can be suppressed. Using an OPC technique, the distance between the N/P boundary and the active region for an outer-most metal gate can be lengthened to be as great as the other distances between the active region and other metal gates. Thus, the threshold voltage shift is significantly reduced. Another advantage is that the process of the present disclosure is fully compatible with existing process flow, and thus no additional fabrication process (or related fabrication equipment) is needed. Therefore, the present disclosure requires no extra fabrication costs. Yet one more advantage is that the customers designing the layout of the ICs need not revise their original layout designs, since the OPC features can be added and implemented by a foundry during fabrication.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a first doped active region disposed in a substrate, wherein the first doped active region extends in a first direction;
a second doped active region disposed in a substrate, wherein the second doped active region extends in the first direction;
a first metal gate disposed over the first doped active region, wherein the first metal gate has a first dimension measured in a second direction different from the first direction;
a second metal gate disposed over the first doped active region, wherein the second metal gate has a second dimension measured in the second direction, the first and second dimensions being different;
a third metal gate disposed over the second doped active region, wherein the third metal gate has a third dimension measured in the second direction; and
a fourth metal gate disposed over the second doped active region, wherein the fourth metal gate has a fourth dimension measured in the second direction, the third and fourth dimensions being different, and
wherein the first metal gate and the second metal gate each include a first type work function metal, and
wherein the third metal gate and the fourth metal gate each include a second type work function metal that is opposite the first type work function metal.

2. The semiconductor device of claim 1, wherein the first direction is perpendicular to the second direction.

3. The semiconductor device of claim 1, wherein:
the second metal gate is located closer to an edge of the first doped active region than the first metal gate; and
the second dimension is greater than the first dimension.

4. The semiconductor device of claim 1, wherein the first doped active region and the second doped active region include source and drain regions.

5. The semiconductor device of claim 1, wherein:
the fourth metal gate is located closer to an edge of the second doped active region than the third metal gate; and
the fourth dimension is smaller than the third dimension.

6. The semiconductor device of claim 1, wherein:
the first metal gate and the third metal gate form a first N/P interface; and
the second metal gate and the fourth metal gate form a second N/P interface.

7. The semiconductor device of claim 6, wherein:
the first metal gate extends beyond the first N/P interface by a first distance in the second direction;
the second metal gate extends beyond the second N/P interface by a second distance in the second direction; and
the first distance is less than the second distance.

8. The semiconductor device of claim 7, wherein a ratio of the second distance to the first distance is in a range from about 1:1 to about 1.5:1.

9. The semiconductor device of claim 1, wherein the first metal gate and the second metal gate each include a high-k gate dielectric and a metal gate electrode.

10. The semiconductor device of claim 1, wherein the first dimension is less than the second dimension, and
wherein the third dimension is greater than the fourth dimension.

11. A semiconductor device, comprising:
a first doped active region and a second doped active region disposed in a substrate, wherein the first doped active region and the second doped active region have elongate shapes and each extend along a first axis;
a first metal gate and a second metal gate each disposed over the first doped active region, wherein the first metal gate and the second metal gate each have an elongate shape and extend along a second axis perpendicular to the first axis; and
a third metal gate and a fourth metal gate each disposed over the second doped active region, wherein the third metal gate and the fourth metal gate each have an elongate shape and extend along the second axis;
wherein:
the first metal gate and the third metal gate define a first N/P interface;
the second metal gate and the fourth metal gate define a second N/P interface; and
the first N/P interface is located closer to a first boundary of the first doped active region than the second N/P interface, the first boundary being measured along the first axis.

12. The semiconductor device of claim 11, wherein the second N/P interface is located closer to a second boundary of the first doped active region than the first N/P interface, the second boundary being measured along the second axis.

13. The semiconductor device of claim 11, wherein:
the first, second, third, and fourth metal gates have first, second, third, and fourth dimensions measured along the second axis, respectively;
the first dimension is less than the second dimension; and
the third dimension is greater than the fourth dimension.

14. The semiconductor device of claim 11, wherein:
the first doped active region and the second doped active region include source and drain regions; and
the first, second, third, and fourth metal gates each include a high-k gate dielectric and a metal gate electrode.

15. The semiconductor device of claim 14, wherein:
the metal gate electrodes of the first metal gate and the second metal gate each include a P-type work function metal; and
the metal gate electrodes of the third metal gate and the fourth metal gate each include an N-type work function metal.

16. A semiconductor device, comprising:
a doped active region disposed in a substrate, the doped active region having an elongate shape and extends in a first direction;
a plurality of first metal gates disposed over the active region, wherein the first metal gates each extend in a second direction different from the first direction, and wherein an outer-most first metal gate has a greater dimension measured in the second direction than the rest of the first metal gates; and
a plurality of second metal gates disposed over the substrate but not over the doped active region, wherein the second metal gates contain different materials than the first metal gates, and wherein the second metal gates each extend in the second direction and form a plurality of respective N/P boundaries with the first metal gates.

17. The semiconductor of claim 16, wherein:
the doped active region includes a source/drain region for a P-type transistor;
the first metal gates each include a P-type work function metal; and
the second metal gates each include an N-type work function metal.

18. The semiconductor of claim 16, wherein a distance between the doped active region and an outer-most N/P boundary exceeds a distance between the doped active region and other N/P boundaries.

19. The semiconductor of claim 16, wherein the first direction is approximately perpendicular to the second direction.

* * * * *